United States Patent
Cheng (10) Patent No.: US 7,911,787 B2
(45) Date of Patent: Mar. 22, 2011

(54) ELECTRONIC ASSEMBLY

(75) Inventor: Chun-Hsiung Cheng, Taoyuan County (TW)

(73) Assignee: Gemtek Technology Co., Ltd., Hsinchu (TW)

( * ) Notice: Subject to any disclaimer, the term of this patent is extended or adjusted under 35 U.S.C. 154(b) by 0 days.

(21) Appl. No.: 12/616,849

(22) Filed: Nov. 12, 2009

(65) Prior Publication Data

US 2011/0002101 A1    Jan. 6, 2011

(51) Int. Cl.
  H05K 7/20    (2006.01)
  B65D 6/28    (2006.01)
(52) U.S. Cl. ........ 361/690; 361/689; 361/692; 220/4.02
(58) Field of Classification Search .................. None
  See application file for complete search history.

(56) References Cited

U.S. PATENT DOCUMENTS

| | | | | |
|---|---|---|---|---|
| 4,901,882 A | * | 2/1990 | Goncalves | 220/324 |
| 5,691,878 A | * | 11/1997 | Ahn et al. | 361/674 |
| 5,846,092 A | * | 12/1998 | Feldman et al. | 439/76.1 |
| 5,944,210 A | * | 8/1999 | Yetter | 220/4.21 |
| 6,111,760 A | * | 8/2000 | Nixon | 361/814 |
| 6,137,680 A | * | 10/2000 | Kodaira et al. | 361/697 |
| 6,444,904 B1 | * | 9/2002 | Holman et al. | 174/520 |
| 6,560,105 B1 | * | 5/2003 | Roy et al. | 361/690 |
| 6,757,155 B2 | * | 6/2004 | Koike et al. | 361/600 |
| 6,881,077 B2 | * | 4/2005 | Throum | 439/76.1 |
| 6,894,891 B2 | * | 5/2005 | Darr et al. | 361/601 |

* cited by examiner

*Primary Examiner* — Boris L Chervinsky
(74) *Attorney, Agent, or Firm* — Rosenberg, Klein & Lee (57) ABSTRACT

An electronic assembly includes a casing structure defining an interior space for receiving at least one electronic component, an exterior space isolated from the interior space and a heat dissipating path along which heat generated by the electronic component is expelled from the interior space to the exterior space. The casing structure includes a first casing part and a would-be coupling unit. The first casing part includes an engagement unit having a bottom seat extending into the interior space and defining at least one flow passage along the heat dissipating path and a first coupling member projecting from the bottom seat. The would-be coupling unit includes a second coupling member coupled to the first coupling member within the interior space.

15 Claims, 9 Drawing Sheets

ELECTRONIC ASSEMBLY

This application claims the benefits of the Taiwan Patent Application Serial NO. 098212789, filed on Jul. 4, 2009, the subject matter of which is incorporated herein by reference.

BACKGROUND OF THE INVENTION

1. Field of the Invention

The present invention relates to an electronic assembly, more particularly to an electronic assembly including a casing structure that can dissipate the generated heat effectively from an interior space to an exterior space of the assembly.

2. Description of the Prior Art

The manufacturers of the electronic fields have notice problems concerning the heat dissipation of high-performed and high-speed electronic assemblies. In the prior art, an electronic assembly generally includes a post disposed within a casing to support the casing structure in shape. Since the post for supporting the casing structure is usually solid, and retards the smooth heat flow from an interior to an exterior thereof, this, in turn, lowers the heat-dissipation ability in the electronic assembly.

Regarding the above-mentioned drawback, the inventor has invented an electronic assembly including a casing structure having a post frame formed with at least one flow passage such that heat generated during the operation of the assembly can be dissipated via the flow passage to an exterior, thereby enhancing the heat dissipation ability of the assembly.

SUMMARY OF THE INVENTION

The object of the present invention is to provide an electronic assembly including a casing structure free from those disadvantages encountered during use of the prior art electronic assembly.

The electronic assembly according to the present invention includes a casing structure defining an interior space for receiving at least one electronic component, an exterior space isolated from the interior space and a heat dissipating path along which heat generated by the electronic component is expelled from the interior space to the exterior space.

The casing structure includes a first casing part and a would-be coupling unit. The first casing part includes an engagement unit having a bottom seat extending into the interior space and defining at least one flow passage along the heat dissipating path and a first coupling member projecting from the bottom seat. The would-be coupling unit includes a second coupling member coupled to the first coupling member within the interior space.

Preferably, the bottom seat includes a seat body defining the flow passage and at least one reinforced rib projecting laterally and outwardly from the seat body in order to strengthen rigidity of the bottom seat.

In one embodiment, the would-be coupling unit is a second casing part that cooperates with the first casing part to define the interior space therebetween In another embodiment, the would-be unit is a post frame installed within the interior space.

In the application of the present invention, the first coupling member is a recess while the second coupling member is a projection for fittingly extending into the recess. Alternately, the recess can be a blind hole while the projection is a cross in cross-section.

In another application of the present invention, the first coupling member is a projection while the second coupling member is a recess for fittingly receiving the projection therein. The projection is a cross in cross-section while the recess is a blind hole.

In yet another application of the present invention, the first coupling member is a hook while the second coupling member is a loop adapted to engage with the hook.

In other application of the present invention, the first coupling member is a first hook while the second coupling member is a second hook adapted to engage with the first hook.

Alternately, the first coupling member is a loop while the second coupling member is a second hook adapted to engage with the hook.

In the prior art technology, since the post itself is a solid and thus retards the heat flow generated during operation of the prior art electronic assembly. In the present invention, the casing structure defines an interior space and an engagement unit having a bottom seat extending into the interior space and defining at least one flow passage so that the heat generated due to operation thereof is expelled via the flow passage to an exterior space isolated from the interior space.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTION OF THE PREFERRED EMBODIMENTS

Figure 1:
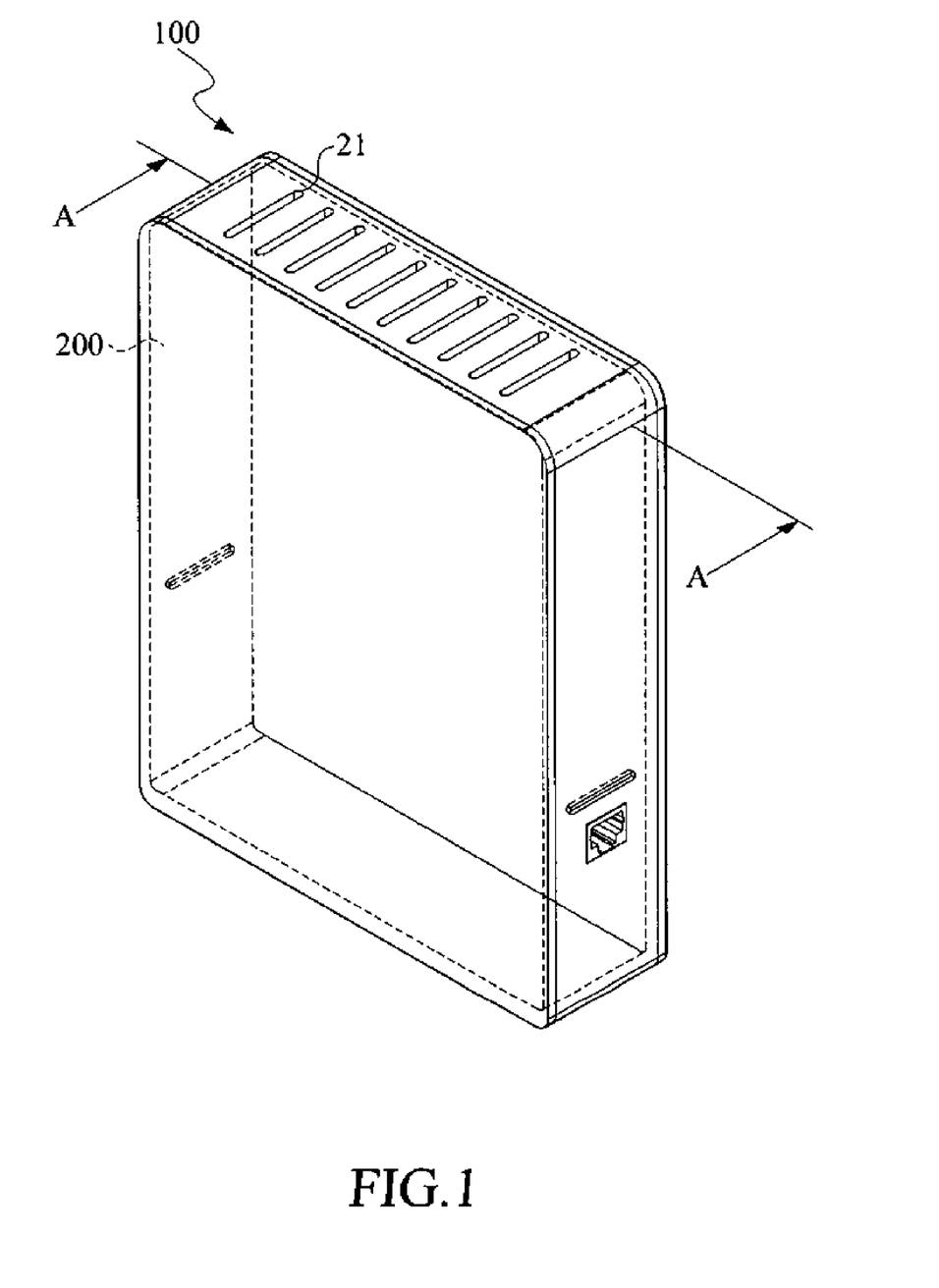
FIG. 1 is a perspective view of the first embodiment of an electronic assembly of the present invention.

FIG. 1 is a perspective view of the first embodiment of an electronic assembly of the present invention, and includes a casing structure 100. The electronic assembly can be a transceiver. The casing structure 100 defines an interior space 200 for receiving at least one electronic component (not shown), an exterior space (not shown) isolated from the interior space 200 and a heat-dissipating vent 21 between the interior and exterior spaces via which heat generated by the electronic component is expelled from the interior space 200 to the exterior space.

Figure 2:
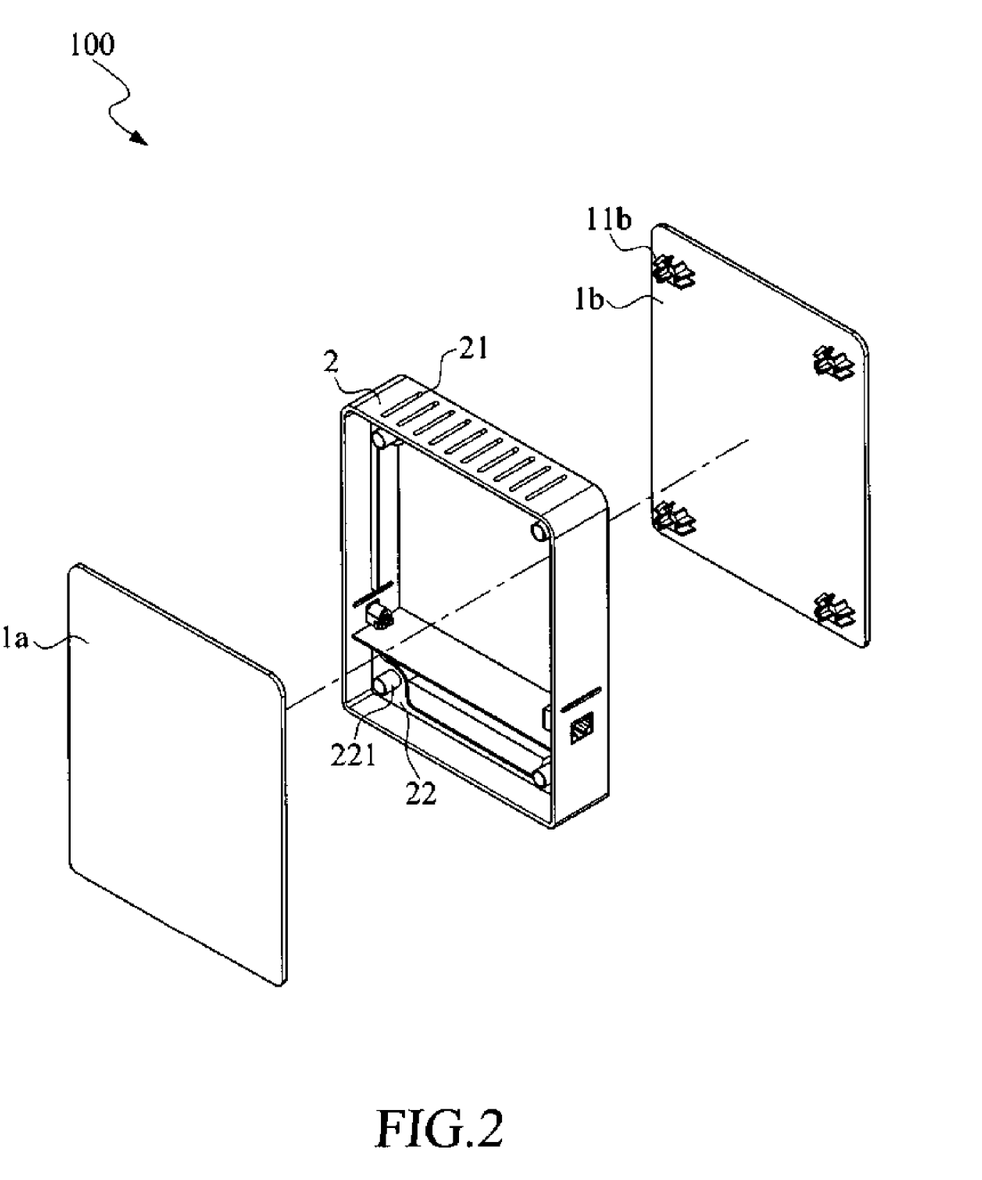
FIG. 2 is an exploded view of the first embodiment of the electronic assembly of the present invention.

FIG. 2 is an exploded view of the first embodiment of the electronic assembly of the present invention. As illustrated, the casing structure 100 includes two first casing parts 1a, 1b and one second casing part 2. Each of the first casing parts 1a, 1b in fact is a partition plate formed with four engagement units 11a, 11b on an inner side at four corners thereof (only four engagement units on one partition are visible).

Figure 3:
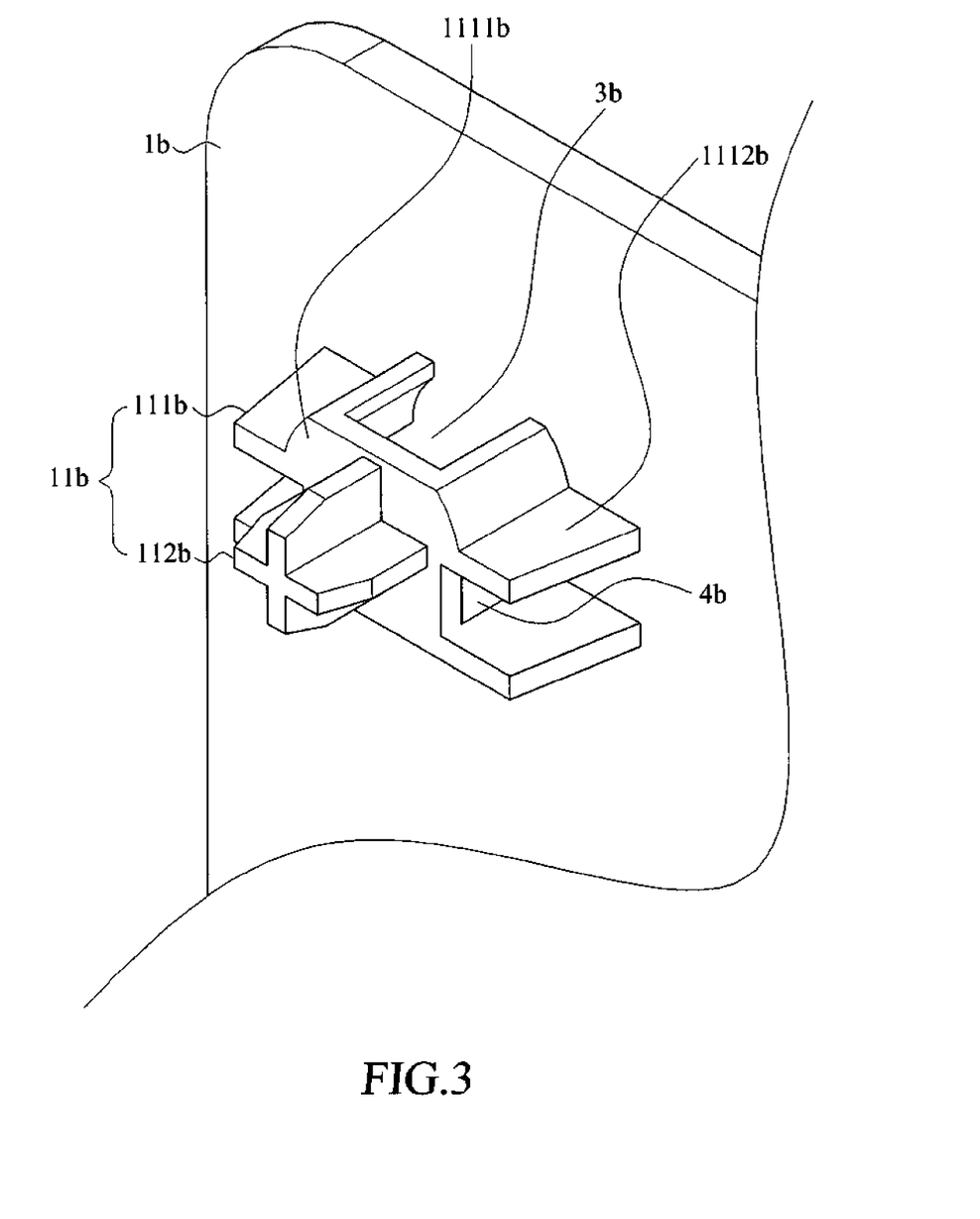
FIG. 3 shows an enlarged view of an engagement unit employed in the first embodiment of the electronic assembly of the present invention.

FIG. 3 shows an enlarged view of an engagement unit employed in the first embodiment of the electronic assembly of the present invention. As shown, each of the engagement units 11a, 11b has a bottom seat 111b including a seat body 1111b extending into the interior space 200 and two pairs of reinforced ribs 1112b projecting laterally and outwardly from four opposite sides of the seat body 1111b so as to define two flow passages 3b, 4b one traversing the other such that the seat body 1111b is formed with four openings in spatial communication with the flow passages 3b, 4b. Since the reinforced ribs 1112b project from the respective openings, the rigidity of the bottom seat 111b is strengthened. Each of the engagement units 11a, 11b further has a first coupling member 112b projecting from the bottom seat 111b. The first coupling member 112b can be a projection in the form of a cross in cross-section and its other detailed structure will be explained in the following paragraphs.

Referring again to FIG. 2, the second casing part 2 is a rectangular body 2 which cooperates with the partition plates 1a, 1b to defines the interior space 200 therein. The rectangular body 2 is formed with a plurality of heat-dissipating vents 21 at two opposite sides thereof via which the interior space 200 is spatially communicated with the exterior space of the casing structure. The rectangular body 2 has a post frame 22 installed within the interior space 200 and serving as a would-be coupling member. The post frame 22 has two opposite sides respectively formed with four second coupling members 221 at four corners thereof (only four coupling members on one side of the post frame are visible).

In this embodiment, each second coupling member 221 can be a blind hole or a recess. As illustrated, four second coupling members 221 on one side of the rectangular frame 2 are coupled respectively to four first coupling members 11a (not visible) of the first partition plate 1a while four second coupling members 221 on the other side of the rectangular frame 2 are coupled respectively to four first coupling members 11b (not visible) of the second partition plate 1b, thereby mounting the first and second partition plates 1a, 1b on two opposite side of the rectangular body to define the interior space 200.

Figure 4:
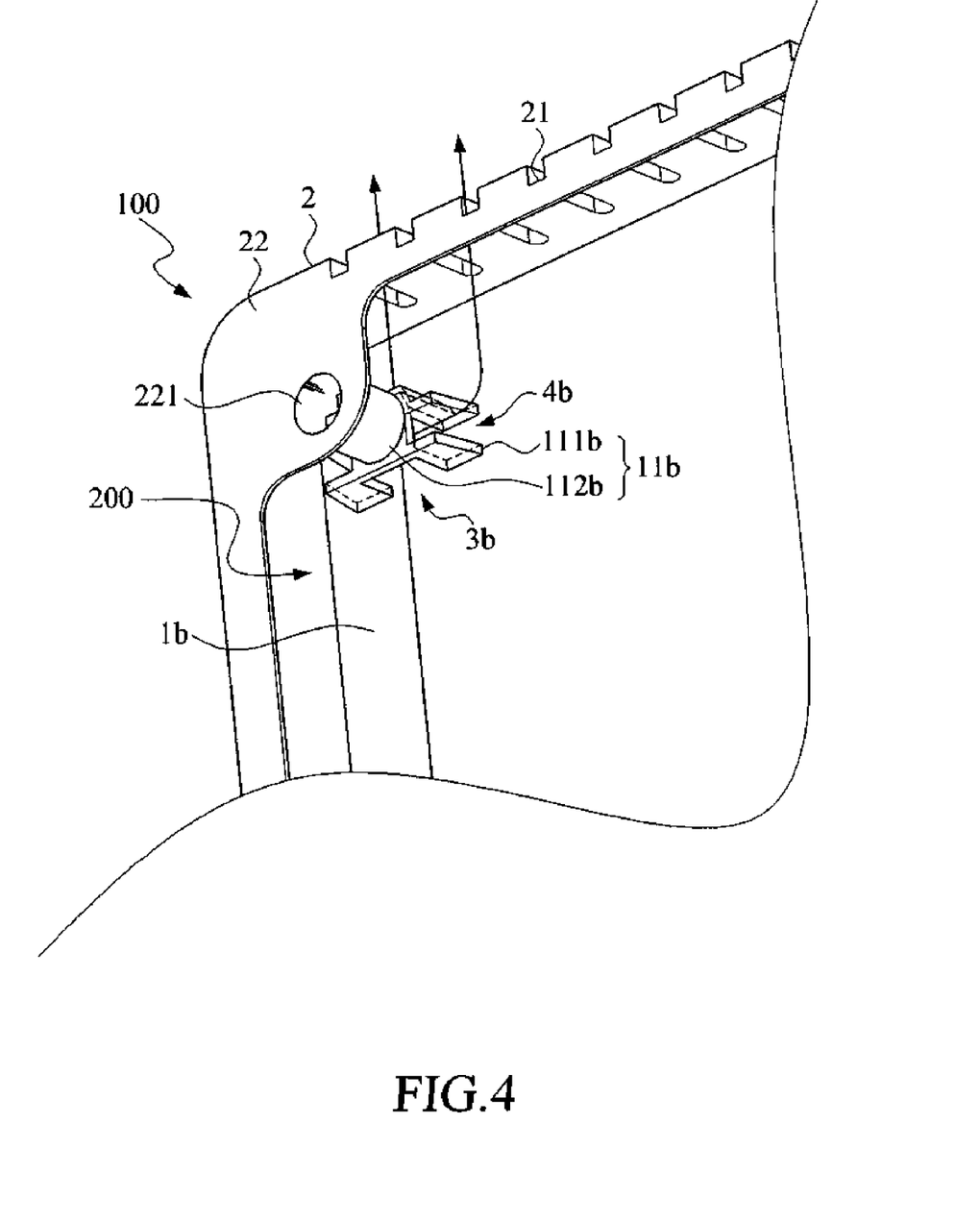
FIG. 4 shows a cross section of the electronic assembly of the present invention taken along lines A-A in FIG. 1 to illustrate a heat dissipating path.

FIG. 4 is a cross section of the electronic assembly of the present invention taken along lines A-A in FIG. 1 to illustrate a heat dissipating path. As illustrated, the first coupling members 112b of the engagement units 11b in the first partition plate 1b are coupled respectively to the respective second coupling members 221 of the rectangular body 2. Note that the bottom seat 111b defines two pairs of flow passages 3b, 4b.

The rectangular body 2 is formed with a plurality of heat-dissipating vents 21 at upper and lower parts and are in spatial communication with the interior space 200. Under this condition, the flow passages 3b, 4b formed by the engagement units 11b on the partition plates do not hinder the heat flow in the interior space such that the heat generated from the electronic components (not shown) passes through the flow passages 3b, 4b to the exterior along the heat-dissipating path via the heat-dissipating vents 21. Note that the heat dissipating path shown in FIG. 4 is not restricted due to formation of the four openings in the seat body 1111b.

Figure 5:
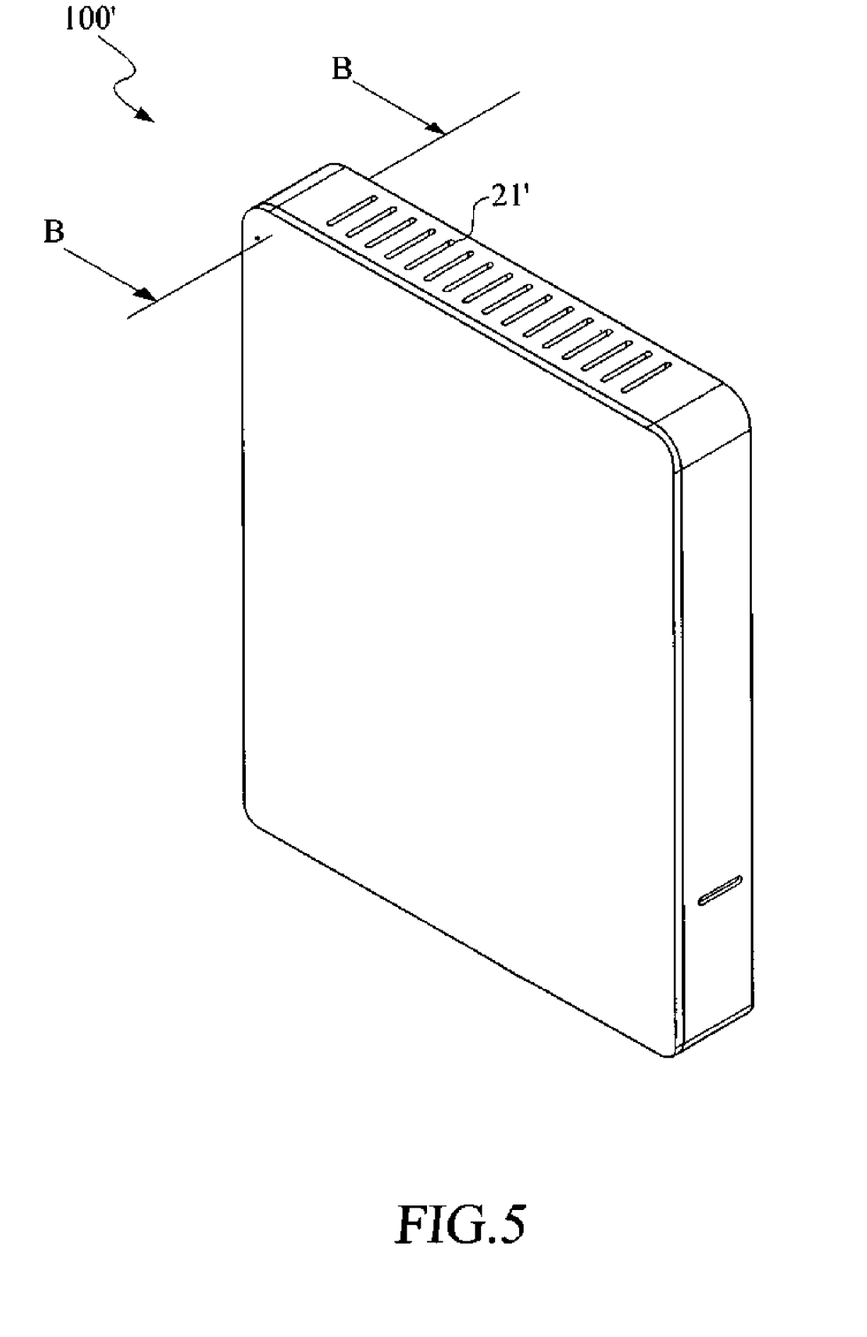
FIG. 5 is a perspective view of the second embodiment of the electronic assembly of the present invention.

FIG. 5 is a perspective view of the second embodiment of the electronic assembly of the present invention. As shown, the casing structure 100' is formed with at least one heat-dissipating vent 21' for expelling the heat generated due to operation of the electronic components in the interior space.

Figure 6:
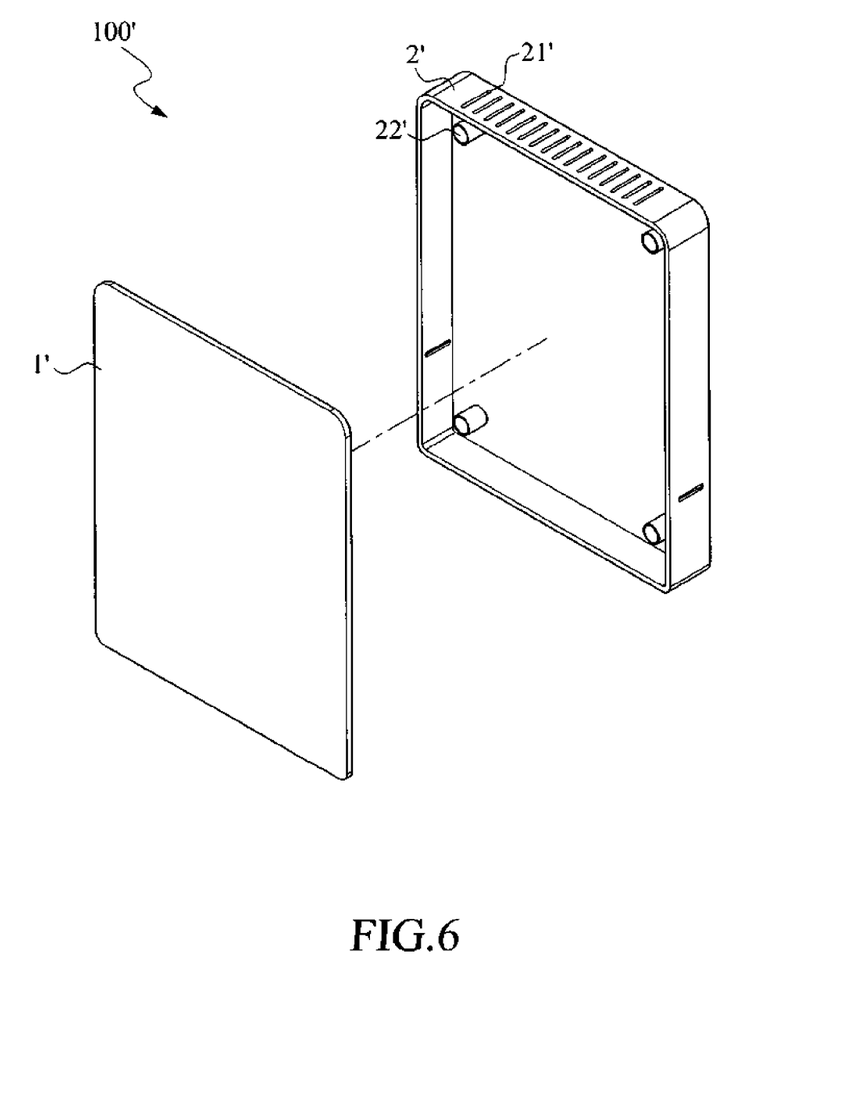
FIG. 6 an exploded view of the second embodiment of the electronic assembly of the present invention.

FIG. 6 an exploded view of the second embodiment of the electronic assembly of the present invention and has the structure similar to the first embodiment. The only difference resides in that the casing structure 100' includes a first casing part 1' in the form of partition plate and formed with four engagement units 11' (not visible since formed on inner surface) and a second casing part 2' is formed with a single opening at one side to be covered by the first casing part 1'.

Figure 7A:
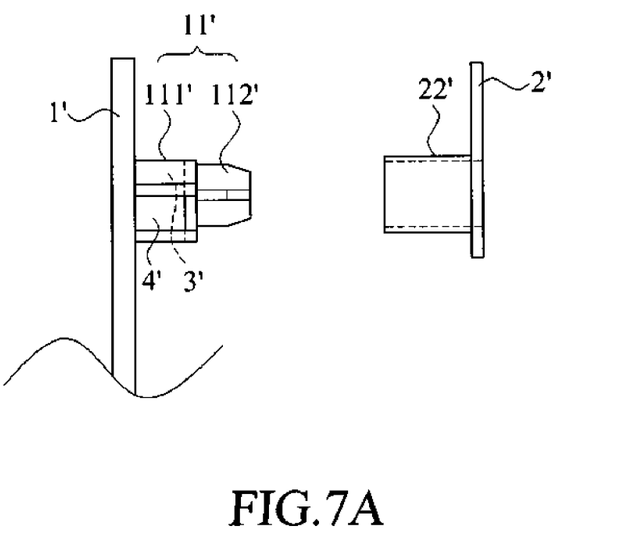
FIG. 7A is a cross-section view of the second embodiment taken along lines B-B in FIG. 5 to illustrate a first application of the electronic assembly of the present invention.

FIG. 7A is a cross-section view of the second embodiment taken along lines B-B in FIG. 5, illustrating a first application of the electronic assembly of the present invention. As illustrated, the engagement unit 11' includes a bottom seat 111' defining the two flow passages 3', 4' and a first coupling member 112' in the form of a projection having a cross shape in cross-section.

Referring again to FIG. 7A (also see FIG. 6), the rectangular body 2' is opened at one side, and has four second coupling members 22' at four corners. In this application, each second coupling member can be a blind hole or recess for fittingly receiving a respective one of the first coupling members 112' formed at four corner of the partition plate 1'.

Figure 7B:
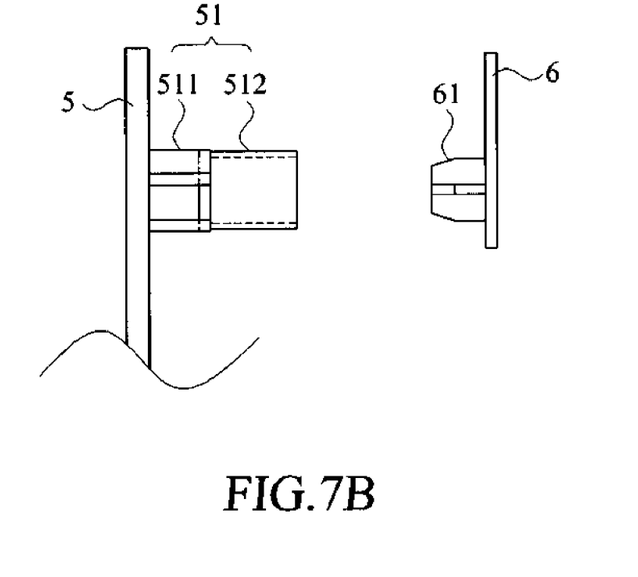
FIG. 7B is a cross-section view of the second embodiment, illustrating a second application of the electronic assembly of the present invention.

FIG. 7B is a cross-section view of the second embodiment, illustrating a second application of the electronic assembly of the present invention. As illustrated, the first casing part 5 has an engagement unit 51 including a bottom seat 511 and a first coupling member 512 projecting from the bottom seat 511. The second casing part 6 has a second coupling member 61 for coupling with the first coupling member 512. In this application, the second coupling member 61 can be a projection while the first coupling member 512 is a recess for fittingly receiving the projection therein. Alternately, the projection is formed with a blind hole while the first coupling member 512 is a projection having a cross shape in cross-section for fittingly extending into the blind hole.

Figure 7C:
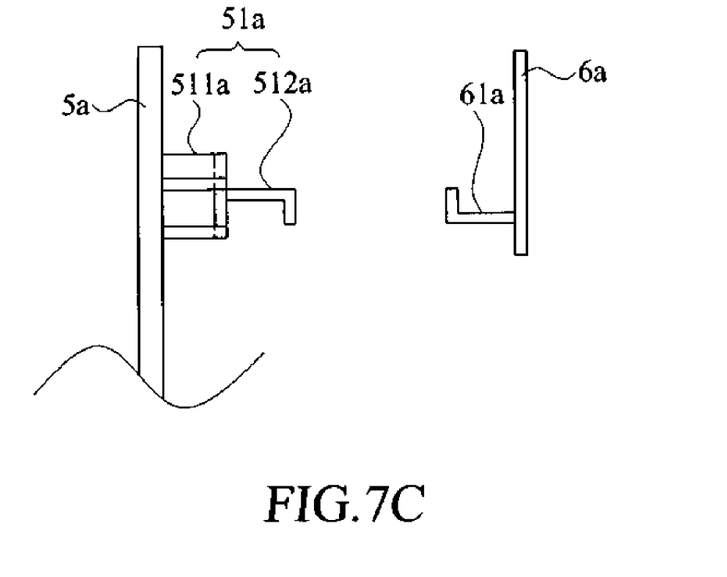
FIG. 7C is a cross-section view of the second embodiment, illustrating a third application of the electronic assembly of the present invention.

FIG. 7C is a cross-section view of the second embodiment, illustrating a third application of the electronic assembly of the present invention. As illustrated, the first casing part 5a has an engagement unit 51a including a bottom seat 511a and a first coupling member 512a projecting from the bottom seat 511a. The second casing part 6a has a second coupling member 61b for coupling with the first coupling member 512a. In this application, the first coupling member 512a is a first hook while the second coupling member 61a is a second hook adapted to engage the first hook.

Figure 7D:
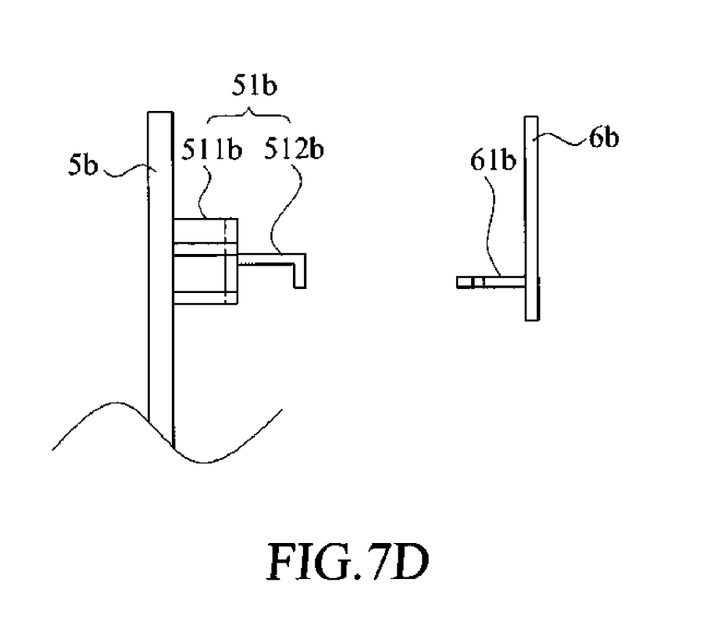
FIG. 7D is a cross-section view of the second embodiment, illustrating a fourth application of the electronic assembly of the present invention.

FIG. 7D is a cross-section view of the second embodiment, illustrating a fourth application of the electronic assembly of the present invention. As illustrated, the first casing part 5b has an engagement unit 51b including a bottom seat 511b and a first coupling member 512b projecting from the bottom seat 511b. The second casing part 6b has a second coupling member 61b for coupling with the first coupling member 512b. In this application, the first coupling member 512b is a hook while the second coupling member 61b is a loop adapted to engage with the hook.

Figure 7E:
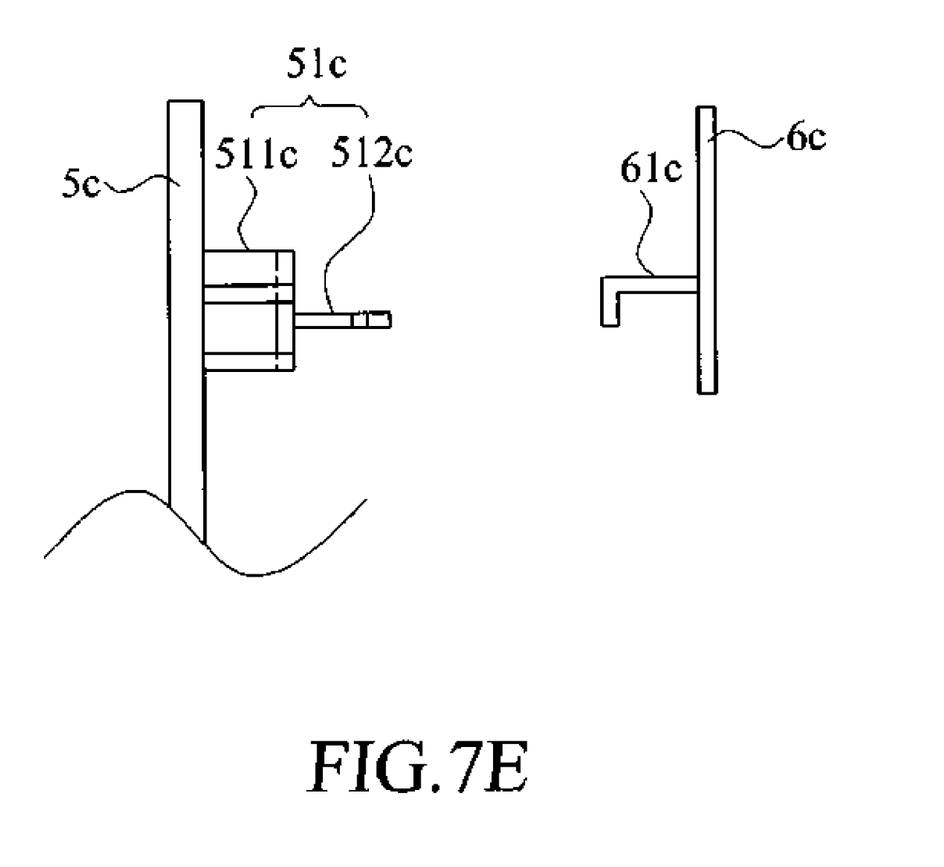
FIG. 7E is a cross-section view of the second embodiment, illustrating a fifth application of the electronic assembly of the present invention.

FIG. 7E is a cross-section view of the second embodiment, illustrating a fifth application of the electronic assembly of the present invention. As illustrated, the first casing part 5c has an engagement unit 51c including a bottom seat 511c and a first coupling member 512c projecting from the bottom seat 511c. The second casing part 6c has a second coupling member 61c for coupling with the first coupling member 512c. In this application, the first coupling member 512c is a loop while the second coupling member 61c is a hook adapted to engage with the loop.

In the prior art electronic assembly, the heat flow within the casing structure is hindered from rapid flow within the interior space due to presence of the post, which is usually solid. In the electronic assembly of the present invention, the casing structure 100 has a post frame disposed within the interior space 200. The engagement unit 11 of the post frame includes a bottom seat formed with at least one flow passage such that presence of bottom seat within the interior space does not hinder the smooth heat flow in the interior space and hence the heat is expelled effectively from the flow passage to the exterior space via the heat dissipating vent 21.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An electronic assembly including a casing structure defining an interior space for receiving at least one electronic component, an exterior space isolated from the interior space and a heat dissipating path along which heat generated by the electronic component is expelled from the interior space to the exterior space, the casing structure comprising:
   a first casing part including
      an engagement unit having a bottom seat extending into the interior space and defining at least one flow passage along the heat dissipating path and a first coupling member projecting from said bottom seat; and
   a would-be coupling unit including
      a second coupling member coupled to said first coupling member within said interior space.

2. The electronic assembly according to claim 1, wherein said would-be coupling unit is a second casing part cooperating with said first casing part to define the interior space.

3. The electronic assembly according to claim 1, wherein said would-be coupling unit is a post frame installed within the interior space.

4. The electronic assembly according to claim 1, wherein the casing structure further defines a heat-dissipating vent between the interior space and the exterior space and extending along the heat dissipating path.

5. The electronic assembly according to claim 1, wherein the electronic assembly is a transceiver.

6. The electronic assembly according to claim 1, wherein said first coupling member has a recess while said second coupling member is a projection for fittingly extending into said recess.

7. The electronic assembly according to claim 6, wherein said projection is a cross in cross-section.

8. The electronic assembly according to claim 6, wherein said recess is a blind hole.

9. The electronic assembly according to claim 1, wherein said first coupling member is a projection while said second coupling member is a recess for fittingly receiving said projection therein.

10. The electronic assembly according to claim 9, wherein said projection is a cross in cross-section.

11. The electronic assembly according to claim 9, wherein said recess is a blind hole.

12. The electronic assembly according to claim 1, wherein said first coupling member is a first hook while said second coupling member is a second hook adapted to engage with said first hook.

13. The electronic assembly according to claim 1, wherein said first coupling member is a hook while said second coupling member is a loop adapted to engage with said hook.

14. The electronic assembly according to claim 1, wherein said first coupling member is a loop while said second coupling member is a hook adapted to engage with said loop.

15. The electronic assembly according to claim 1, wherein said bottom seat includes a seat body and at least one reinforced rib projecting laterally and outwardly from said seat body.

* * * * *